(12) United States Patent
Vissenberg et al.

(10) Patent No.: US 10,072,825 B2
(45) Date of Patent: Sep. 11, 2018

(54) LIGHTING MODULE AND LIGHTING DEVICE COMPRISING A LIGHTING MODULE

(71) Applicant: PHILIPS LIGHTING HOLDING B.V., Eindhoven (NL)

(72) Inventors: Michel Cornelis Josephus Marie Vissenberg, Eindhoven (NL); Olena Ivanova, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/550,221

(22) PCT Filed: Feb. 11, 2016

(86) PCT No.: PCT/EP2016/052878
§ 371 (c)(1),
(2) Date: Aug. 10, 2017

(87) PCT Pub. No.: WO2016/128496
PCT Pub. Date: Aug. 18, 2016

(65) Prior Publication Data
US 2018/0031209 A1    Feb. 1, 2018

(30) Foreign Application Priority Data

Feb. 12, 2015 (EP) .................... 15154794

(51) Int. Cl.
*F21V 19/00* (2006.01)
*F21K 9/232* (2016.01)
(Continued)

(52) U.S. Cl.
CPC ............ *F21V 19/003* (2013.01); *F21K 9/232* (2016.08); *F21K 9/90* (2013.01); *F21V 29/503* (2015.01);
(Continued)

(58) Field of Classification Search
CPC ...... F21V 19/003; F21V 29/503; F21K 9/232; F21K 9/90; H05K 1/028
See application file for complete search history.

(56) References Cited

U.S. PATENT DOCUMENTS 9,750,103 B2 * 8/2017 Mathews ........... H05B 33/0854
2013/0301277 A1   11/2013 Van De Moesdijk et al.
(Continued)

FOREIGN PATENT DOCUMENTS

EP        1046859 A1    10/2000
WO    WO2013124601 A1    8/2013
(Continued)

*Primary Examiner* — Mary Ellen Bowman
(74) *Attorney, Agent, or Firm* — Akarsh P. Belagodu

(57) ABSTRACT

A lighting module (100) is disclosed, comprising an elongated member (110) having an inner surface (112) at least in part delimiting a light-guiding region (114) within the elongated member, wherein the elongated member has a first end (116) a second end (118) and is configured to permit passage of fluid through the light-guiding region (114) and into and out of the first end and the second end, respectively. Light can be out-coupled from the light-guiding region (114) via at least one of the first end (116) and the second end (118). The elongated member (110) includes a carrier which is at least in part flexible and has a first side (131) and a second side (132) opposite to the first side (131). At least one light-emitting element (120) is coupled to the first side (131) of the carrier on a first portion (151) of the carrier. The carrier is arranged such that the second side (132) of the first portion (151) of the carrier at least partially faces the second side (132) of a second portion (152) of the carrier, such that the first side (131) of the first portion (151) of the carrier at least in part constitutes the inner surface (112) of the elongated member (110). By way of such arrangement of the carrier, the at least one light-emitting element (120) can be arranged within the elongated member (110), and may hence
(Continued)

emit light into the light-guiding region (114). A lighting device (200) comprising the lighting module (100) is also disclosed.

14 Claims, 3 Drawing Sheets

(51) Int. Cl.
*F21K 9/90* (2016.01)
*H05K 1/02* (2006.01)
*F21V 29/503* (2015.01)
*F21V 29/506* (2015.01)
*F21Y 107/00* (2016.01)
*F21Y 107/90* (2016.01)
*F21Y 115/10* (2016.01)
*F21V 29/83* (2015.01)

(52) U.S. Cl.
CPC ............ *H05K 1/028* (2013.01); *F21V 29/506* (2015.01); *F21V 29/83* (2015.01); *F21Y 2107/00* (2016.08); *F21Y 2107/90* (2016.08); *F21Y 2115/10* (2016.08); *H05K 2201/051* (2013.01); *H05K 2201/055* (2013.01); *H05K 2201/10106* (2013.01)

(56) References Cited

U.S. PATENT DOCUMENTS

| | | | |
|---|---|---|---|
| 2014/0240990 A1* | 8/2014 | Bae | F21V 29/22 362/294 |
| 2016/0041324 A1* | 2/2016 | Nava | G02B 6/0001 362/311.01 |

FOREIGN PATENT DOCUMENTS

| | | |
|---|---|---|
| WO | WO2014080301 A1 | 5/2014 |
| WO | WO2014118754 A1 | 8/2014 |
| WO | WO2014128667 A1 | 8/2014 |

* cited by examiner

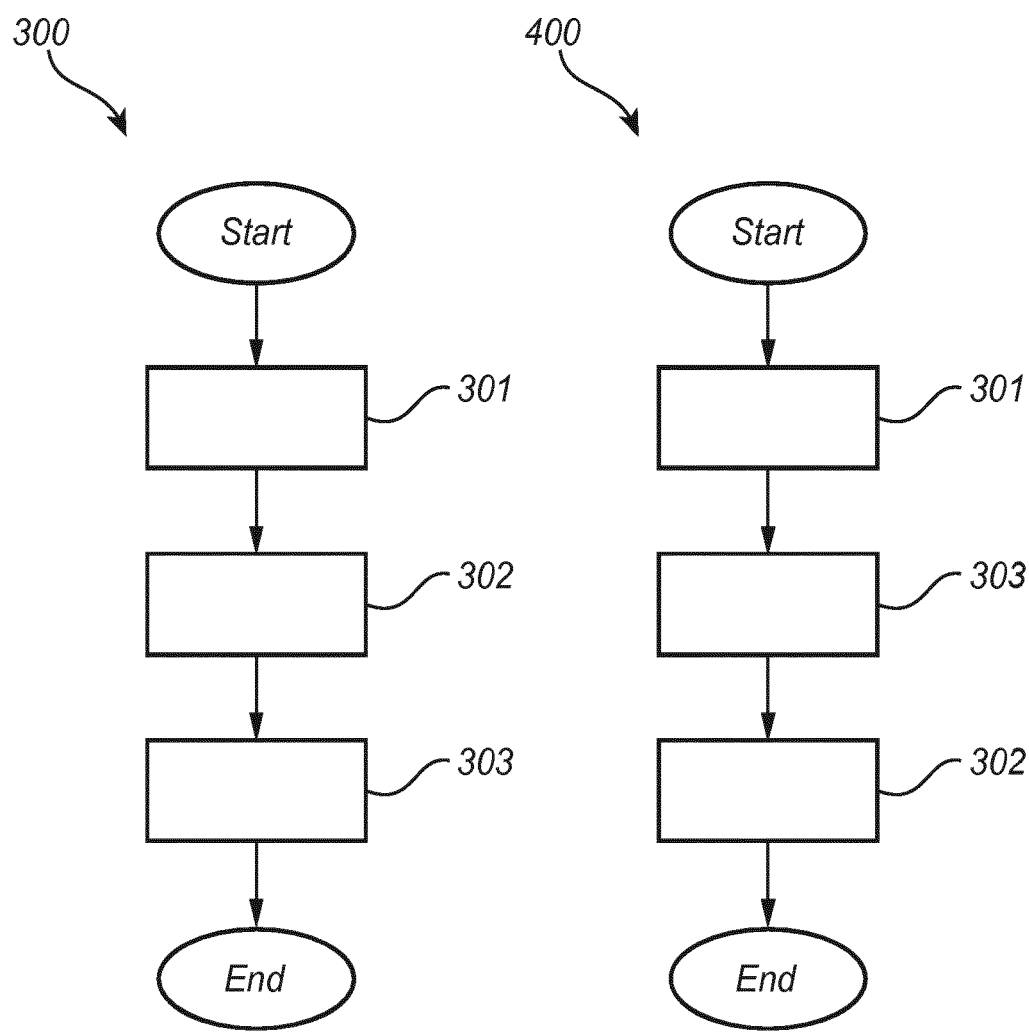

LIGHTING MODULE AND LIGHTING DEVICE COMPRISING A LIGHTING MODULE

CROSS-REFERENCE TO PRIOR APPLICATIONS

This application is the U.S. National Phase application under 35 U.S.C. § 371 of International Application No. PCT/EP2016/052878, filed on Feb. 11, 2016, which claims the benefit of European Patent Application No. 15154794.0, filed on Feb. 12, 2015. These applications are hereby incorporated by reference herein.

TECHNICAL FIELD

The present invention generally relates to the field of lighting equipment and devices. Specifically, the present invention relates to a lighting module for use in a lighting device and a lighting device comprising the lighting module.

BACKGROUND

The use of light-emitting diodes (LEDs) for illumination purposes continues to attract attention. Compared to incandescent lamps, fluorescent lamps, neon tube lamps, etc., LEDs provide numerous advantages such as a longer operational life, reduced power consumption, an increased efficiency related to the ratio between light energy and heat energy, etc. Solid state based light sources such as LED based light sources may have different optical characteristics compared to incandescent light sources. In particular, solid state based light sources may provide a more directed light distribution and a higher (i.e. cooler) color temperature compared to incandescent light sources. Therefore, efforts have been made in order to make solid state based lighting devices mimic or resemble traditional incandescent lighting devices, e.g. with respect to light distribution and/or color temperature. In bulb lighting devices based on LEDs, commonly referred to as "retrofit lamps" since these LED lamps are often designed to have the appearance of a traditional incandescent light bulb and to be mounted in conventional sockets, etc., the light emitting filament wire is replaced with one or more LEDs. The atmosphere within the bulb is generally air. However, cooling of the LEDs may pose a problem in LED based retrofit lamps. Overheating of LEDs can lead to reduced lifetime, decreased light output or failure of the LEDs.

SUMMARY

In one lighting device architecture for realizing a LED bulb or retrofit lamp, the LEDs are mounted onto the outside of a tubular carrier with open ends which tubular carrier is arranged within a bulb for example made of glass or ceramic. Such a tubular carrier may generally be referred to as an elongated hollow structure having one or more open ends, which structure for example may be cylindrical, conical, truncated conical, funnel-shaped, etc., and may for example have a circular, triangular, rectangular, etc., cross-section. The tubular carrier provides functionality similar to that of a chimney, allowing a fluid (or gas) flow through the tubular carrier, thereby facilitating cooling of the tubular carrier and the LEDs by way of convection taking place within the chimney (i.e. heat generated by the LEDs is transferred to fluid within the tubular carrier, thereby creating a convection flow of fluid within and through the tubular carrier). Although such a chimney configuration or architecture may provide a relatively high efficiency of heat transport away from the LEDs, it may not be able to realize a uniform light intensity distribution from the LED bulb or retrofit lamp which resembles a traditional incandescent light bulb. For example, a LED bulb or retrofit lamp based on such a chimney configuration or architecture may exhibit a region on the outer surface of the bulb, corresponding to a relatively low intensity of light. Such a 'dark' region may be visible to a viewer, which may not be desired.

In view of the above, a concern of the present invention is to provide a lighting module or lighting device which allows for achieving a more uniform distribution of intensity of light emitted by the lighting module or lighting device as compared to utilizing a chimney configuration or architecture as described in the foregoing.

A further concern of the present invention is to provide a lighting module or lighting device which allows for achieving an efficiency of heat transport away from light-emitting elements in the lighting module or lighting device comparable to that of a chimney configuration or architecture as described in the foregoing or even higher.

A further concern of the present invention is to provide a lighting module or lighting device which addresses the above concerns while being relatively inexpensive to manufacture.

To address at least one of these concerns and other concerns, a lighting module and a method in accordance with the independent claims are provided. Preferred embodiments are defined by the dependent claims.

According to a first aspect, there is provided a lighting module. The lighting module comprises an elongated member, which has an inner surface that at least in part delimits a light-guiding region within the elongated member. The elongated member has a first end a second end, wherein light can be out-coupled from the light-guiding region via at least one of the first end and the second end. The light-guiding region permits passage of fluid therethrough and into and out of the first end and the second end, respectively. The lighting module comprises at least one light-emitting element configured to emit light. The elongated member includes a carrier, or substrate, which is at least in part flexible, and has a first side and a second side opposite to the first side. The at least one light-emitting element is coupled to the first side of the carrier on a first portion of the carrier. The carrier is arranged such that the second side of the first portion of the carrier at least partially faces the second side of a second portion of the carrier, such that the first side of the first portion of the carrier at least in part constitutes the inner surface of the elongated member.

By the elongated member being configured such that the light-guiding region within the elongated member permits passage of fluid therethrough, and into and out of the first end and the second end, respectively, flow of circulation of fluid, e.g. a gas such as air or helium, through the light-guiding region, and hence through the elongated member, is facilitated or enabled. Thus, the elongated member may provide functionality similar to that of a chimney, facilitating or allowing for heat transport by way of convection to take place within the elongated member. Thereby, a relatively high degree of cooling of the light-emitting elements, which are arranged within the elongated member, may be achieved.

As will be discussed further in the following, a lighting module according to the first aspect may be included in a lighting device comprising a light-transmissive envelope at least in part enclosing the lighting module. The light-transmissive envelope may at least in part define a fluidly sealed and enclosed space within which the lighting module is arranged, and which space may include or be filled with a thermally conductive fluid, for example a gas such as air or a gas including helium and/or hydrogen. The lighting device may for example be included in or constitute a LED bulb or retrofit lamp which is connectable to a lamp or luminaire socket by way of some appropriate connector, for example an Edison screw base, a bayonet fitting, or another type of connection suitable for the lamp or luminaire known in the art.

By means of the lighting module according to the first aspect, an increased uniformity in light emission, e.g., with respect to light intensity and/or brightness, around the lighting module may be achieved. There may further be light-emitting element(s) arranged on the outside of the elongated member. For example, the elongated member may have an outer surface configured to couple at least one light-emitting element thereto. By means of the carrier being arranged such that the second side of the first portion of the carrier at least partially faces the second side of a second portion of the carrier, such that the first side of the first portion of the carrier at least in part constitutes the inner surface of the elongated member, to which first side of the first portion of the carrier the at least one light-emitting element is coupled, the at least one light-emitting element can be arranged within the elongated member. By arranging at least one light-emitting element within the elongated member, the region on the outer surface of the light-transmissive envelope towards which an end of the elongated member is directed may be illuminated to the same or substantially the same extent as other regions on the outer surface of the light-transmissive envelope. Thus, any 'dark' region on the outer surface of the light-transmissive envelope, corresponding to a relatively low intensity of light, such as mentioned in the foregoing, may be reduced or even avoided. At the same time, a relatively high degree of cooling of the at least one light-emitting element arranged within the elongated member may be achieved, by means of the 'chimney' functionality or effect which is provided by the elongated member, thereby facilitating or allowing for heat transport by way of convection to take place within the elongated member.

As mentioned in the foregoing, by way of the arrangement of the carrier such that the first side of the first portion of the carrier at least in part constitutes the inner surface of the elongated member, the at least one light-emitting element can be arranged within the elongated member, and may hence emit light into the light-guiding region.

By means of the carrier being at least in part flexible and the arrangement of the carrier such that the first side of the first portion of the carrier at least in part constitutes the inner surface of the elongated member, it may thus be possible to use a carrier which is configured so as to only allow for coupling of light-emitting elements thereto on one side of two oppositely arranged sides, while achieving that one or more light-emitting elements end up on an inner surface of the elongated member, i.e. within the elongated member. In addition, there may be one or more light-emitting elements arranged on the outside of the elongated member, e.g. on an outer surface of the elongated member. A configuration of the carrier of the lighting module according to the first aspect may be less expensive compared to using a carrier which allows for coupling of light-emitting elements thereto on both sides of two oppositely arranged sides, since a carrier of the latter type is usually more expensive than a carrier of the former type.

According to an example, the elongated member may be hollow. The light-guiding region, or cavity, may for example include or be constituted by open void(s), permitting any gas, such as air, to pass through the elongated member.

According to another example, the light-guiding region may include or be constituted by one or material which permits passage of fluid therethrough and at the same time permits propagation or conveyance of light therein, for example along a direction in which the light-guiding region extends. The material may at least in part include a transparent material, allowing light to pass through the material without being scattered.

The inner surface of the elongated member may be specularly or diffusely reflecting, or have surface portions which are specularly and diffusely reflecting, respectively. For example the inner surface may comprise coating or layer including $Al_2O_3$, $BaSO_4$ and/or $TiO_2$. The inner surface of the elongated member may be configured such that it exhibits a reflectivity of more than 80%, or more than 85%, or even more that 90%.

Since the first side of the first portion of the carrier at least in part constitutes the inner surface of the elongated member, the inner surface of the elongated member, or at least a portion thereof, can be made reflective by means of the first side of the carrier (or at least the first side of the first portion of the carrier) being reflective, e.g. by means of a reflective coating provided on the first side of the carrier. Thus, the inner surface of the elongated member, or at least a portion thereof, can be made reflective possibly without need of using a reflective coating or element on both the first side and the second side of the carrier.

The second side of the first portion of the carrier, which at least partially faces the second side of a second portion of the carrier, may or may not be in direct or indirect (e.g., via one or more intermediate components) contact with the second side of the second portion of the carrier, or vice versa.

The carrier may for example be bent and/or folded so as to achieve an arrangement of the carrier such that the first side of the first portion of the carrier at least in part constitutes the inner surface of the elongated member. For example, the carrier may be arranged such that the first portion of the carrier is folded over the second portion of the carrier, such that the second side of the first portion of the carrier at least partially faces the second side of the second portion of the carrier. The fold may for example have an extension parallel or substantially parallel to a longitudinal axis of the elongated member or lighting module. That is, the folding of the carrier may be such that the resulting fold of the carrier in the elongated member runs parallel or substantially parallel to a longitudinal axis of the elongated member or lighting module. According to another example, the fold may in addition or in alternative have an extension in a plane perpendicular or substantially perpendicular to a longitudinal axis of the elongated member or lighting module. That is, the folding of the carrier may be such that the resulting fold of the carrier in the elongated member runs in a plane which is perpendicular or substantially perpendicular to a longitudinal axis of the elongated member or lighting module.

Arranging the carrier such that the second side of the first portion of the carrier at least partially faces the second side of a second portion of the carrier, possibly by way of folding the first portion of the carrier over the second portion of the carrier, may facilitate or allow for achieving a relatively high mechanical stability of the elongated member. For example in a case where the carrier comprises a flexible foil, folding the foil may result in an increased mechanical rigidity of the elongated member, and/or an improved capability to withstand any forces and/or impact on the elongated member which the elongated member may be subjected to during manufacturing of the lighting device without being damaged or deformed.

The first portion of the carrier, which may be folded over the second portion of the carrier, may or may not be in direct or indirect contact with the second portion of the carrier, or vice versa. The second side of the first portion of the carrier, which at least partially faces the second side of a second portion of the carrier, may or may not be in direct or indirect contact with the second side of the second portion of the carrier, or vice versa.

The elongated member may for example have a cylindrical, or tube-like, shape, or a conical shape, or a combination of cylindrical and conical sections.

In the context of the present application, by the elongated member having a cylindrical shape it is meant that the elongated member is cylinder-like, i.e. having a shape or form at least in part resembling the shape or form of a cylinder, and not necessarily shaped as a perfect or ideal cylinder. In the context of the present application, by the elongated member having a conical shape it is meant that the elongated member is cone-like, i.e. having a shape or form at least in part resembling the shape or form of a cone, and not necessarily shaped as a perfect or ideal cone.

The elongated member may for example comprise a rolled-up arrangement of the at least in part flexible carrier.

The carrier may be configured to couple one or more light-emitting elements thereto and/or support one or more light-emitting elements thereon. The carrier may for example include a flexible printed circuit board (PCB) and/or a flexible foil ('flexfoil'). The carrier may be configured to transfer heat, generated by the at least one light-emitting element when in use, away from the at least one light-emitting element. Thus the carrier may be configured so as to exhibit a heat transferring capacity and/or functionality.

The elongated member may comprise an outer surface which is configured to couple at least one light-emitting element thereto. Thus, there may be light-emitting element(s) coupled to the outside of the elongated member as well as to the inside of the elongated member. The first side of the second portion of the carrier may at least in part constitute the outer surface of the elongated member.

According to one or more embodiments of the present invention, the first portion of the carrier may be smaller than the second portion of the carrier.

According to a second aspect, there is provided a method of manufacturing a lighting module. The lighting module comprises an elongated member which has an inner surface configured to at least in part delimit a light-guiding region within the elongated member. The elongated member has a first end and a second end, wherein light can be out-coupled from the light-guiding region via at least one of the first end and the second end. The light-guiding region permits passage of fluid therethrough and into and out of the first end and the second end, respectively. The elongated member includes a carrier which is at least in part flexible, and which has a first side and a second side opposite to the first side. The method comprises coupling at least one light-emitting element to the first side of the carrier on a first portion of the carrier. The at least one light-emitting element is configured to emit light. The method comprises arranging the carrier so as to form the elongated member. The method comprises arranging the carrier such that the second side of the first portion of the carrier at least partially faces the second side of a second portion of the carrier, such that the first side of the first portion of the carrier at least in part constitutes the inner surface of the elongated member.

By way of the arranging of the carrier such that the first side of the first portion of the carrier at least in part constitutes the inner surface of the elongated member, the at least one light-emitting element can become arranged within the elongated member, and may hence emit light into the light-guiding region.

The carrier may be arranged so as to form the elongated member with the first side of the carrier, except for the first side of the first portion of the carrier, facing outwards. The first side of the second portion of the carrier may at least in part constitute the outer surface of the elongated member.

The arranging of the carrier such that the second side of the first portion of the carrier at least partially faces the second side of a second portion of the carrier may for example comprise folding the first portion of the carrier over the second portion of the carrier.

The arranging of the carrier so as to form the elongated member may comprise forming the elongated member by rolling up the carrier, so as to form a rolled-up arrangement of the carrier. Thereby, the carrier, and possibly the elongated member, may for example attain a cylindrical shape.

According to one or more embodiments of the present invention, the arranging of the carrier such that the second side of the first portion of the carrier at least partially faces the second side of a second portion of the carrier may be carried out before arranging of the carrier so as to form the elongated member for example by way of rolling up the carrier to form a rolled-up arrangement.

According to one or more other embodiments of the present invention, the arranging of the carrier such that the second side of the first portion of the carrier at least partially faces the second side of a second portion of the carrier may be carried out after arranging of the carrier so as to form the elongated member for example by way of rolling up the carrier to form a rolled-up arrangement.

A lighting module according to the first aspect is suitable for use for example in lighting devices having a light bulb, e.g. having a light-transmissive envelope at least in part enclosing the lighting module, with the lighting module being arranged within the light bulb or light-transmissive envelope.

According to a third aspect, there is provided a lighting device. The lighting device comprises a lighting module according to the first aspect. The lighting device may comprise a light-transmissive envelope which at least in part encloses the lighting module. The light-transmissive envelope may at least in part define a fluidly sealed and enclosed space within which the lighting module is arranged, and which space may include or be filled with air or a thermally conductive fluid, for example a gas including helium and/or hydrogen.

The lighting device may comprise a base for connection to a lamp socket. The base may include or be constituted by any suitable type of connector, for example an Edison screw base, a bayonet fitting, or another type of connection. The lighting device may comprise more than one lighting module according to the first aspect.

As known in the art, the lighting module and/or the lighting device may include circuitry capable of converting electricity from a power supply to electricity suitable to operate or drive the at least one light-emitting element. The circuitry may be capable of at least converting between Alternating Current and Direct Current and converting voltage into a suitable voltage for operating or driving the at least one light-emitting element.

The at least one light-emitting element may for example include or be constituted by a solid state light emitter. Examples of solid state light emitters include LEDs, OLEDs, and laser diodes. Solid state light emitters are relatively cost efficient light sources since they in general are relatively inexpensive and have a relatively high optical efficiency and a relatively long lifetime. However, in the context of the present application, the term "light-emitting element" should be understood to mean substantially any device or element that is capable of emitting radiation in any region or combination of regions of the electromagnetic spectrum, for example the visible region, the infrared region, and/or the ultraviolet region, when activated e.g. by applying a potential difference across it or passing a current through it. Therefore a light-emitting element can have monochromatic, quasi-monochromatic, polychromatic or broadband spectral emission characteristics. Examples of light-emitting elements include semiconductor, organic, or polymer/polymeric LEDs, violet LEDs, blue LEDs, optically pumped phosphor coated LEDs, optically pumped nano-crystal LEDs or any other similar devices as would be readily understood by a person skilled in the art. Furthermore, the term light-emitting element can, according to one or more embodiments of the present invention, mean a combination of the specific light-emitting element or light-emitting elements which emit the radiation in combination with a housing or package within which the specific light-emitting element or light-emitting elements are positioned or arranged. For example, the term light-emitting element can encompass a bare LED die arranged in a housing, which may be referred to as a LED package.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the invention will be described below with reference to the accompanying drawings.

FIGS. 3 and 4 are schematic flowcharts of methods according to embodiments of the present invention.

Figure 1:
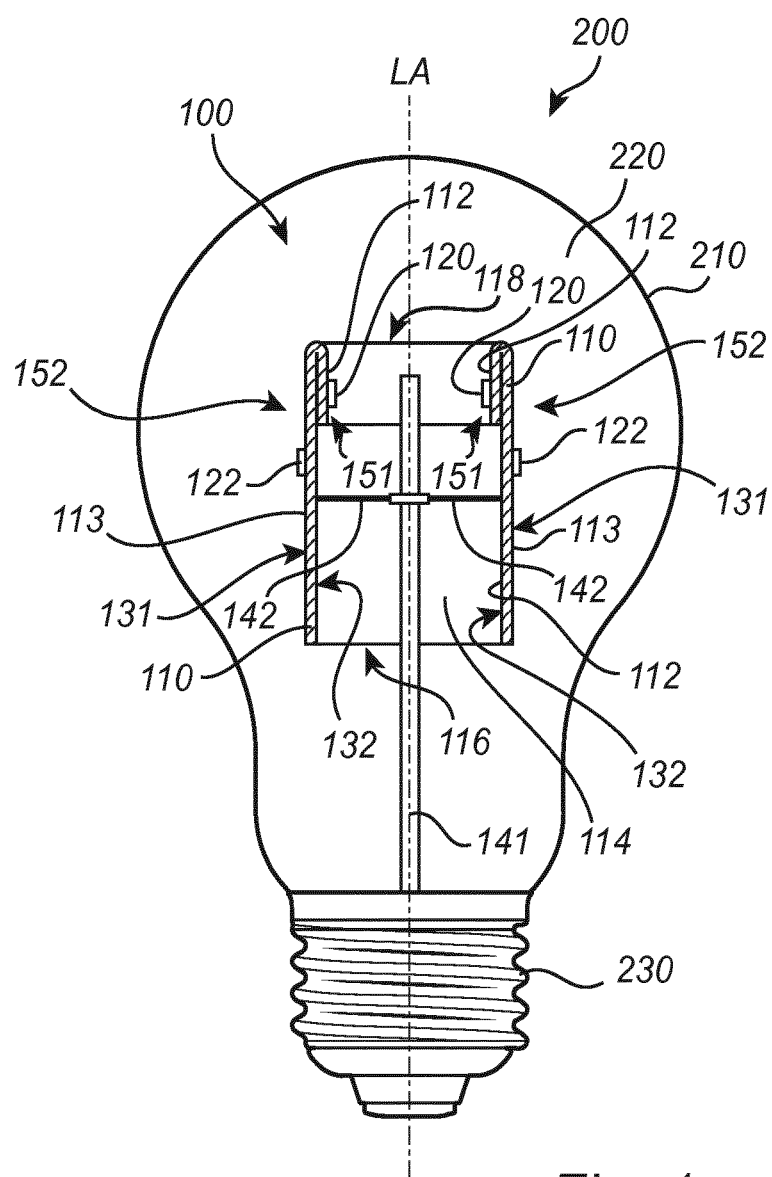
FIGS. 1 and 2 are schematic sectional side views of lighting devices according to embodiments of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art.

In the drawings, identical reference numerals denote the same or similar components having a same or similar function, unless specifically stated otherwise.

FIG. 1 is a schematic sectional side view of a lighting device 200 according to an embodiment of the present invention. The lighting device 200 comprises a lighting module 100 and a light-transmissive envelope 210 which encloses the lighting module 100.

In accordance with the embodiment of the present invention illustrated in FIG. 1, the light-transmissive envelope 210 is bulb-shaped. However, the bulb-shape of the light-transmissive envelope 210 depicted in FIG. 1 is according to an example. Other shapes of the light-transmissive envelope 210 are possible, and the light-transmissive envelope 210 may in principle have any shape. The light-transmissive envelope 210 may at least in part define an enclosed space 220 within which the lighting module 100 is arranged. The light-transmissive envelope 210 may be configured such that the space 220 is a fluidly sealed space, and which space may include or be filled for example with air or a thermally conductive fluid, for example a gas including helium and/or hydrogen. In accordance with the embodiment of the present invention illustrated in FIG. 1, the lighting device 200 may comprise a base 230 for connection to a lamp or luminaire socket (not shown in FIG. 1). The base 230 may include or be constituted by any suitable type of coupler or connector, for example an Edison screw base, a bayonet fitting, or any other type of connection which may be suitable for the particular type of lamp or luminaire.

The lighting module 100 comprises an elongated member 110 having an inner surface 112 which at least in part defines, or delimits, a light-guiding region 114 within the elongated member 110. The elongated member 110 has a first end 116 a second end 118. Light can be out-coupled from the light-guiding region 114 via the first end 116 and the second end 118. The elongated member 110 is configured such that the light-guiding region 114 permits passage of fluid through the light-guiding region 114, and into and out of the first end 116 and the second end 118, respectively. To that end, according to an example, the elongated member 110 may be hollow, such that the light-guiding region 114 or cavity includes or is constituted by an open void, as illustrated in FIG. 1, thereby permitting any fluid or gas such as air to pass through the elongated member 110. However, it is not necessary for the elongated member 110 to be hollow. According to another example (not shown in FIG. 1), the light-guiding region 114 may include or be constituted by a structure and/or one or more materials which permit passage of fluid through the light-guiding region 114 while at the same time permitting propagation or conveyance of light in the light-guiding region 114. The one or more materials of the light-guiding region 114 may at least in part include a transparent material, allowing light to pass through the material (substantially) without being scattered. The one or more materials of the light-guiding region 114 could for example include a porous material, i.e. a material containing pores, or voids.

By the elongated member 110 being configured such that the light-guiding region 114 within the elongated member 110 permits passage of fluid through the elongated member 110 and into and out of the first end 116 and the second end 118, respectively, flow of circulation of fluid, e.g. a gas such as air or helium, through the light-guiding region 114, and hence through the elongated member 110, may be facilitated or even enabled. Thereby the elongated member 110 may provide functionality similar to that of a chimney, facilitating or allowing for heat transport by way of convection to take place within the elongated member 110 by a continuous circulation of fluid through the light-guiding region 114, and hence through the elongated member 110.

In accordance with the embodiment of the present invention illustrated in FIG. 1, the elongated member 110 has a cylindrical shape. However, a cylindrical shape of the elongated member 110 is not necessary and other shapes of the elongated member 110 are contemplated, such as for example conical.

The elongated member 110 includes a carrier, or substrate, which is at least in part flexible. For example, the carrier may comprise a flexible foil. For purposes of illustration, the carrier has been drawn in FIG. 1 with a relatively large thickness. It is however to be understood that the elements in FIG. 1 are not necessarily to scale.

The carrier has a first side 131 and a second side 132 that is opposite to the first side 131. The lighting module 100 comprises light-emitting elements 120 configured to emit light. The light-emitting elements 120 are coupled to the first side 131 of the carrier on a first portion 151 of the carrier. The carrier is arranged such that the second side 132 of the first portion 151 of the carrier faces the second side 132 of a second portion 152 of the carrier, such that the first side 131 of the first portion 151 of the carrier in part constitutes the inner surface 112 of the elongated member 110, as indicated in FIG. 1.

More particularly, in accordance with the embodiment of the present invention illustrated in FIG. 1, the carrier is arranged such that the first portion 151 of the carrier is folded over the second portion 152 of the carrier. And further in accordance with the embodiment of the present invention illustrated in FIG. 1, the second side 132 of the first portion 151 of the carrier, which faces the second side 132 of the second portion 152 of the carrier, is in contact with the second side 132 of the second portion 152 of the carrier.

With reference to the embodiment of the present invention illustrated in FIG. 1, the lighting module 100 may for example be manufactured as described in the following.

The carrier which will constitute the elongated member 110 may originally be a substantially rectangular, possibly sheet- or substrate-like, carrier, having a first side 131 and a second side 132 opposite to the first side 131. The carrier may for example include or be constituted by a flexible foil. One or more light-emitting elements 120 are coupled to the first side 131 of the carrier on a first portion 151 of the carrier. The first portion 151 of the carrier, e.g. in the form of a top 'band' of the rectangular carrier at one of the shortest sides of the rectangular carrier, is folded back over the remaining, second portion 152 of the carrier, such that the first side 131 of the first portion 151 of the carrier will at least in part constitute the inner surface 112 of the elongated member 110. The carrier can then be arranged so as to form the elongated member 110, for example by rolling up the carrier so as to form a rolled-up arrangement of the carrier, whereby the elongated member 110 attains a cylindrical shape such as illustrated in FIG. 1, and the first side 131 of the first portion 151 of the carrier at least in part constitutes the inner surface 112 of the elongated member 110. The carrier can be fixedly arranged in the rolled-up arrangement for example by means of any fixing means known in the art, for example by means of adhesive, wrapping means (such as a strap or the like) which may be wrapped around the rolled-up arrangement, etc. In alternative, the carrier is first arranged so as to form the elongated member 110, for example by rolling up the carrier so as to form a rolled-up arrangement of the carrier, and then the first portion 151 of the carrier, e.g. in the form of a top 'band' of the rectangular carrier at one of the shortest sides of the rectangular carrier, is folded back over the remaining, second portion 152 of the carrier. Using any of these approaches, the light-emitting element(s) 120 may thereby end up on the inside of the elongated member 110. As indicated in FIG. 1, the fold may have an extension in a plane perpendicular to a longitudinal axis LA of the elongated member 110. That is, the folding of the carrier may be such that the resulting fold of the carrier in the elongated member 110 runs in a plane which is perpendicular or substantially perpendicular to a longitudinal axis LA of the elongated member 110 or lighting module 100. According to the embodiment of the present invention illustrated in FIG. 1, the longitudinal axis LA coincides with a longitudinal axis of the lighting module 100.

In accordance with the embodiment of the present invention illustrated in FIG. 1, the lighting module 100 further comprises light-emitting elements 122 configured to emit light and arranged on the outside of the elongated member 110. For example, the light-emitting elements 122 arranged on the outside of the elongated member 110 may be coupled to an outer surface 113 of the elongated member 110, which may be configured to couple the light-emitting elements 122 thereto. As illustrated in FIG. 1, the first side 131 of the second portion 152 of the carrier may constitute the outer surface 113 of the elongated member 110.

Any one of the light-emitting elements 120, 122 may for example comprise a LED. The number of light-emitting elements 120 within the elongated member 110 and the number of light-emitting elements 122 on the outside of the elongated member 110 are both according to an example. There may in principle be any number of light-emitting elements 120 within the elongated member 110 and any number of light-emitting elements 122 on the outside of the elongated member 110.

There may be a support structure which supports the lighting module 100 in the lighting device 200. In accordance with the embodiment of the present invention illustrated in FIG. 1, the support structure comprises a stem or cylindrical support 141 or the like connected to and/or supported by the base 230. The stem 141 may extend for example along a longitudinal axis of the elongated member 110 and into the elongated member 110 via the first end 116. There may be support rods 142 or the like, possibly extending laterally from the stem 141 within the elongated member 110, and being coupled to the inner surface 112 of the elongated member 110.

As known in the art, the lighting device 200 may include circuitry capable of converting electricity from a power supply to electricity suitable to operate or drive the light-emitting elements 120, 122 and/or power any other electrical components that may be included in the lighting device 200. Such circuitry, which is not shown in FIG. 1, may be capable of at least converting between Alternating Current and Direct Current and converting voltage into a suitable voltage for operating or driving the light-emitting elements 120, 122.

Figure 2:
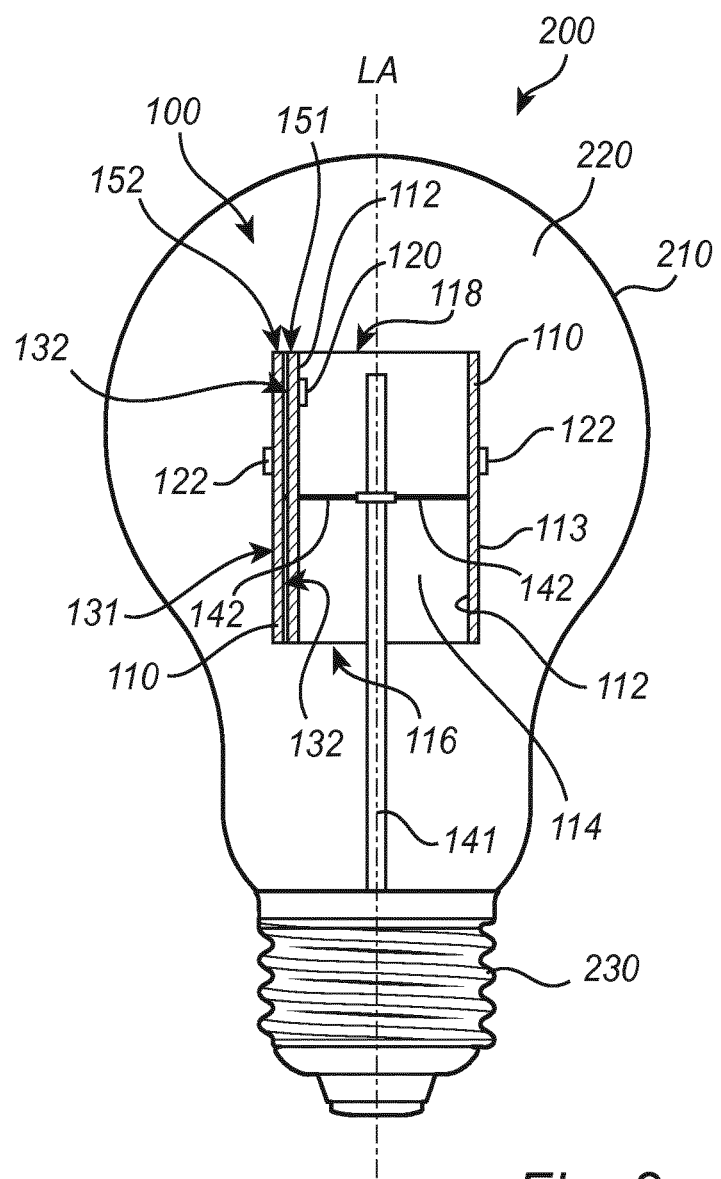

FIG. 2 is a schematic sectional side view of a lighting device 200 according to an embodiment of the present invention. The lighting device 200 comprises a lighting module 100 which is enclosed by a light-transmissive envelope 210, similarly to as in the lighting device 200 illustrated in FIG. 1. The lighting module 100 in the lighting device 200 illustrated in FIG. 2 is similar to the lighting module 100 in the lighting device 200 illustrated in FIG. 1, but differs in the configuration of the fold in the carrier of the elongated member 110 of the lighting module 100 illustrated in FIG. 2.

In accordance with the embodiment of the present invention illustrated in FIG. 2, the carrier is arranged such that the first portion 151 of the carrier is folded over the second portion 152 of the carrier. It is to be noted that FIG. 2 shows a section of the elongated member 110 where the first portion 151 of the carrier is folded over the second portion 152 of the carrier. Further in accordance with the embodiment of the present invention illustrated in FIG. 2, the second side 132 of the first portion 151 of the carrier, which faces the second side 132 of the second portion 152 of the carrier, is in contact with the second side 132 of the second portion 152 of the carrier. In contrast to the elongated member 110 of the lighting module 100 illustrated in FIG. 1, the fold in the carrier of the elongated member 110 of the lighting module illustrated in FIG. 2 has an extension parallel to the longitudinal axis LA of the elongated member 110. That is, the folding of the carrier may be such that the resulting fold of the carrier in the elongated member 110 runs in a plane which is parallel or substantially parallel to a longitudinal axis LA of the elongated member 110 or lighting module 100.

The manufacturing of the lighting module 100 illustrated in FIG. 2 may be similar to the manufacturing of the lighting module 100 illustrated in FIG. 1, as described in the foregoing. With reference to the embodiment of the present invention illustrated in FIG. 2, the carrier which will constitute the elongated member 110 may originally be a substantially rectangular, possibly sheet- or substrate-like, carrier, having a first side 131 and a second side 132 opposite to the first side 131. The carrier may for example include or be constituted by a flexible foil. One or more light-emitting elements 120 are coupled to the first side 131 of the carrier on a first portion 151 of the carrier. The first portion 151 of the carrier, e.g. in the form of a side 'band' of the rectangular carrier at one of the longest sides of the rectangular carrier, is folded back over the remaining, second portion 152 of the carrier, such that the first side 131 of the first portion 151 of the carrier will at least in part constitute the inner surface 112 of the elongated member 110. The carrier can then be arranged so as to form the elongated member 110, for example by rolling up the carrier so as to form a rolled-up arrangement of the carrier, whereby the elongated member 110 attains a cylindrical shape such as illustrated in FIG. 2, and the first side 131 of the first portion 151 of the carrier at least in part constitutes the inner surface 112 of the elongated member 110. The carrier can be fixedly arranged in the rolled-up arrangement for example by means of any fixing means known in the art. In alternative, the carrier is first arranged so as to form the elongated member 110, for example by rolling up the carrier so as to form a rolled-up arrangement of the carrier, and then the first portion 151 of the carrier, e.g. in the form of a side 'band' of the rectangular carrier at one of the longest sides of the rectangular carrier, is folded back over the remaining, second portion 152 of the carrier. Using any of these approaches, the light-emitting element(s) 120 may thereby end up on the inside of the elongated member 110.

FIG. 3 is a schematic flowchart of a method 300 according to an embodiment of the present invention. The method 300 is for manufacturing a lighting module, which lighting module comprises an elongated member having an inner surface configured to at least in part delimit a light-guiding region within the elongated member. The elongated member has a first end and a second end. Light can be out-coupled from the light-guiding region via at least one of the first end and the second end. The light-guiding region permits passage of fluid therethrough and into and out of the first end and the second end, respectively. The elongated member includes a carrier, which is at least in part flexible, and has a first side and a second side that is opposite to the first side. The method 300 comprises coupling at least one light-emitting element to the first side of the carrier on a first portion of the carrier, 301. The at least one light-emitting element is configured to emit light. The carrier is arranged so as to form the elongated member, 302. The carrier is arranged such that the second side of the first portion of the carrier at least partially faces the second side of a second portion of the carrier, 303, such that the first side of the first portion of the carrier at least in part constitutes the inner surface of the elongated member.

FIG. 4 is a schematic flowchart of a method 400 according to another embodiment of the present invention. The method 400 illustrated in FIG. 4 differs from the method 300 illustrated in FIG. 3 in that the arranging of the carrier such that the second side of the first portion of the carrier at least partially faces the second side of a second portion of the carrier, 303, is carried out before the arranging of the carrier so as to form the elongated member, 302.

In conclusion, a lighting module is disclosed, comprising an elongated member having an inner surface at least in part delimiting a light-guiding region within the elongated member, wherein the elongated member has a first end a second end and is configured to permit passage of fluid through the light-guiding region and into and out of the first end and the second end, respectively. Light can be out-coupled from the light-guiding region via at least one of the first end and the second end. The elongated member includes a carrier which is at least in part flexible and has a first side and a second side opposite to the first side. At least one light-emitting element is coupled to the first side of the carrier on a first portion of the carrier. The carrier is arranged such that the second side of the first portion of the carrier at least partially faces the second side of a second portion of the carrier, such that the first side of the first portion of the carrier at least in part constitutes the inner surface of the elongated member. By way of such arrangement of the carrier, the at least one light-emitting element can be arranged within the elongated member, and may hence emit light into the light-guiding region. A lighting device comprising the lighting module is also disclosed.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting module comprising:
   an elongated member having an inner surface at least in part delimiting a light-guiding region within the elongated member, wherein the elongated member has a first end and a second end, wherein light can be out-coupled from the light-guiding region via at least one of the first end and the second end, and wherein the light-guiding region permits passage of fluid therethrough and into and out of the first end and the second end, respectively; and at least one light-emitting element configured to emit light;

wherein the elongated member includes a carrier which is at least in part flexible and has a first side and a second side opposite to the first side, wherein the at least one light-emitting element is coupled to the first side of the carrier on a first portion of the carrier, and wherein the carrier is arranged such that the second side of the first portion of the carrier at least partially faces the second side of a second portion of the carrier, such that the first side of the first portion of the carrier at least in part constitutes the inner surface of the elongated member.

2. A lighting module according to claim 1, wherein the carrier is arranged such that the first portion of the carrier is folded over the second portion of the carrier such that the second side of the first portion of the carrier at least partially faces the second side of the second portion of the carrier.

3. A lighting module according to claim 2, wherein the fold has an extension parallel to a longitudinal axis of the elongated member.

4. A lighting module according to claim 2, wherein the fold has an extension in a plane perpendicular to a longitudinal axis of the elongated member.

5. A lighting module according to claim 1, wherein the elongated member comprises a rolled-up arrangement of the carrier.

6. A lighting module according to claim 1, wherein the carrier comprises a flexible foil.

7. A lighting module according to claim 1, wherein the elongated member comprises an outer surface configured to couple at least one light-emitting element thereto, and wherein the first side of the second portion of the carrier at least in part constitutes the outer surface of the elongated member.

8. A lighting module according to claim 1, wherein the first portion of the carrier is smaller than the second portion of the carrier.

9. A method of manufacturing a lighting module, the lighting module comprising an elongated member having an inner surface configured to at least in part delimit a light-guiding region within the elongated member, wherein the elongated member has a first end and a second end, wherein light can be out-coupled from the light-guiding region via at least one of the first end and the second end, and wherein the light-guiding region permits passage of fluid therethrough and into and out of the first end and the second end, respectively, and wherein the elongated member includes a carrier which is at least in part flexible and has a first side and a second side opposite to the first side;

the method comprising:

coupling at least one light-emitting element to the first side of the carrier on a first portion of the carrier, the at least one light-emitting element configured to emit light;

arranging the carrier so as to form the elongated member;

arranging the carrier such that the second side of the first portion of the carrier at least partially faces the second side of a second portion of the carrier, such that the first side of the first portion of the carrier at least in part constitutes the inner surface of the elongated member.

10. A method according to claim 9, wherein arranging the carrier so as to form the elongated member comprises forming the elongated member by rolling up the carrier so as to form a rolled-up arrangement of the carrier.

11. A method according to claim 9, wherein the arranging of the carrier such that the second side of the first portion of the carrier at least partially faces the second side of a second portion of the carrier comprises folding the first portion of the carrier over the second portion of the carrier.

12. A method according to claim 10, wherein arranging the carrier such that the second side of the first portion of the carrier at least partially faces the second side of a second portion of the carrier is carried out before arranging the carrier so as to form the elongated member.

13. A method according to claim 10, wherein arranging the carrier such that the second side of the first portion of the carrier at least partially faces the second side of a second portion of the carrier is carried out after arranging the carrier so as to form the elongated member.

14. A lighting device comprising:
a lighting module according to claim 1; and
a light-transmissive envelope at least in part enclosing the lighting module.

* * * * *